United States Patent
Jelonnek

(10) Patent No.: US 7,030,797 B2
(45) Date of Patent: Apr. 18, 2006

(54) BROADBAND SIGMA-DELTA MODULATOR

(75) Inventor: Björn Jelonnek, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/499,521

(22) PCT Filed: Dec. 19, 2002

(86) PCT No.: PCT/EP02/14596
§ 371 (c)(1),
(2), (4) Date: Dec. 7, 2004

(87) PCT Pub. No.: WO03/052941
PCT Pub. Date: Jun. 26, 2003

(65) Prior Publication Data
US 2005/0088326 A1    Apr. 28, 2005

(30) Foreign Application Priority Data
Dec. 19, 2001    (EP) .................................. 01130334

(51) Int. Cl.
*H03M 3/00* (2006.01)
(52) U.S. Cl. ..................................................... 341/143
(58) Field of Classification Search ................ 341/143, 341/144, 155
See application file for complete search history.

(56) References Cited

U.S. PATENT DOCUMENTS

| | | | | | |
|---|---|---|---|---|---|
| 4,692,715 | A | * | 9/1987 | Spence | 331/2 |
| 5,055,843 | A | | 10/1991 | Ferguson, Jr. et al. | 341/143 |
| 6,225,928 | B1 | | 5/2001 | Green | 341/143 |
| 6,587,061 | B1 | * | 7/2003 | Petrofsky | 341/143 |
| 2002/0003847 | A1 | * | 1/2002 | Yamamoto et al. | 375/344 |

FOREIGN PATENT DOCUMENTS

DE    199 37 246    8/1999

* cited by examiner

Primary Examiner—Peguy JeanPierre
(74) Attorney, Agent, or Firm—Staas & Halsey LLP

(57) ABSTRACT

A sigma-delta modulator converting digital input signals x(k) includes a first feedback loop of a spectrally formed output signal y(k) of the sigma-delta modulator and a second feedback loop of a spectrally formed differential signal e(k), obtained from an intermediate signal u(k) and the output signal y(k). The intermediate signal u(k) constitutes the differential signal of the input signal x(k) and the total signal r(k) of the first and second feedback loops. A quantizer determines the output signal y(k) based on the intermediate signal u(k), whereby k is the discrete independent time variable. The sigma-delta converter generates a skew between the output signal y(k) and the input signal x(k).

14 Claims, 4 Drawing Sheets

BROADBAND SIGMA-DELTA MODULATOR

CROSS REFERENCE TO RELATED APPLICATIONS

This application is based on and hereby claims priority to European Application No. 01130334.4 filed on Dec. 19, 2001, the contents of which are hereby incorporated by reference.

BACKGROUND OF THE INVENTION

1. Field of the Invention

The invention relates to a sigma-delta modulator for converting broadband digital input signals.

2. Description of the Related Art

In digital-to-analog converters, as used, for instance, in digital radio communication systems, a digital input signal having $2^N$ signal statuses and a fixed sampling frequency $f_a$ is customarily converted into an analog signal needing to tally as closely as possible with the digital signal in the $-f_a/2$ to $+f_a/2$ frequency range.

The number of signal statuses requiring to be implemented by analog circuitry poses a substantial problem especially when the bit widths N are large. The digital signal is for this reason interpolated by digital filters and what are termed sigma-delta modulators are employed in the digital-to-analog converters which significantly reduce the digital signal's bit width with an increased sampling frequency and transform the quantizing noise increased thereby into previously unused frequency ranges. Structures of sigma-delta modulators achieving forming of the noise signal by higher-order IIR (Infinite Impulse Response) filters are particularly efficient here.

A digital-to-analog converter employing an IIR filter as the interpolation element and one or more sigma-delta modulators for converting the interpolated signals is described in, for example, U.S. Pat. No. 5 786 779.

A cascaded sigma-delta modulator for a digital-to-analog converter is furthermore presented in DE 197 22 434 C1. S. R. Norswothy, R. Schreier, G. Temes: "Delta-Sigma Data Converters, Theory, Design and Simulation", IEEE Press 1997, ISBN 0-7803-1045-4, contains a detailed description of the design of sigma-delta modulators and their mode of operation.

Two approaches are now taken in the sigma-delta modulators to achieve a noise forming:

According to a first approach, higher-order feedback loops are used which permit a reduction to up to two signal statuses (1-bit signaling technique). However, upward of order-3 noise forming these can lead to possible instabilities in the case of high input signals; overshooting of the value range of internal status memories very easily occurs. To counter this, an amplitude-reduced input signal and status memories having clipping characteristics are used in practice as a result of which empirically ascertainable circuit stability can be achieved.

According to a second approach, first- and/or second-order cascaded structures are used which, being of multi-stage design, have stable operating characteristics.

The sigma-delta modulator for converting digital input signals x(k) can include a first feedback loop of a spectrally formed output signal y(k) of the sigma-delta modulator and a second feedback loop of a spectrally formed differential signal e(k) obtained from an intermediate signal u(k) and from the output signal y(k), with the intermediate signal u(k) being the differential signal of the input signal x(k) and the total signal r(k) of the first and second feedback loops, with a quantizer determining the output signal y(k) based on the intermediate signal u(k), and with k being the discrete independent time variable.

A cascaded sigma-delta modulator having the advantages, on the one hand, of a cascaded approach's stability in terms of operating characteristics and easier implementability and, on the other hand, the advantages of a small number of stages of a higher-order feedback loop has been described in DE 199 37 246 A1. The number of signal statuses can be reduced to up to two—corresponding to 1 bit—by incorporating an additional logic. Complex clipping circuitry is eliminated without impairing circuit stability. Owing to the circuit's modularity, an existing structure of an i-th order sigma-delta modulator can be expanded into an i+1-th order circuit by simply an additional logic stage.

Through the cascading of several first-order modulators the quantizing noise in the low frequency range is evaluated particularly intensely in the target function used. The quantized signal needs to exhibit extreme variations in the time domain in order to transform the quantizing noise into the frequency range. The possibility for this is not provided in the case of, for instance, a two-stage signal and is suppressed by the structure according to DE 199 37 246 A1. Consequently, although noise forming has a higher order as a result of cascading, there is only a limited increase in the frequency range with a specific signal-to-noise ratio at a specified measuring bandwidth, especially in the case of a desired relatively low signal-to-noise ratio.

SUMMARY OF THE INVENTION

An aspect of the present invention is therefore to increase stability in the case of sigma-delta modulators or the cascading of sigma-delta modulators and thus generate sigma-delta modulators having a greater useful-signal bandwidth.

According to the invention the sigma-delta converter generates a skew between the output signal y(k) and input signal x(k).

Owing to the skew between x(k) and u(k) or, as the case may be, y(k), the sigma-delta modulator's result is not based exclusively on the momentary value of x(k) but, instead, several time-shifted values are used for the quantizer's decision on an output signal. The sigma-delta modulator's decision is consequently less arbitrarily subject to the momentary status and the quantizing noise in the useful band can be reduced. This makes the sigma-delta converter's characteristics more stable so that, with increasing stability, signals with a greater useful-signal bandwidth can also be processed.

In a development of the invention at least one delay element for generating a skew between the output signal y(k) and input signal x(k) is provided, with the at least one delay element creating a skew between clock cycles dependent on the discrete time variable k, a clock cycle being the difference between two succeeding time variables k and k−1. The delay element makes it possible to control how many succeeding, which is to say time-shifted values, are used for the quantizer's decision on an output signal. This means that the temporal mean-taking depth can be varied by using the delay element. The use of delay elements to time-shift the signals also allows the sigma-delta modulator's causality to be retained.

In a technical implementation the at least one delay element can be arranged in such a way that the input signal x(k) is delayed before the differential signal is formed from the input signal x(k) and total signal r(k) of the first and second feedback loops.

An evaluation unit is advantageously connected upstream of the quantizer with the result signal p(k) from the evaluation unit being routed to the quantizer as an input signal. From the sigma-delta modulator's viewpoint the quantizer's decision is thus made on the basis not only of a momentary value but also of "future" or "past" values; mean-taking is performed on adjacent input values so that the sigma-delta modulator's decision is not subject to the peak values of momentary statuses. Mean-taking in the evaluation unit can be selected to suit the sigma-delta modulator's required embodiment. The peak values smoothed through mean-taking result in the spectral range to limiting of the quantizing noise to a smaller spectral range as the values that can change quickly over their time curve (large frequency) are re-evaluated through the mean-taking. A greater useful bandwidth not disrupted by the spectral influences of the quantizing noise is thus spectrally available to the useful signals. Mean-taking of the predicator therefore results in a reduction in the quantizing noise because the peak values are smoothed, and the reduction in the quantizing noise implies a greater useful-signal bandwidth. The evaluation unit may also be referred to as a predicator.

The evaluation unit can in particular include inputs for the input signal x(k), for the intermediate signal u(k), and for the output signal y(k), and an output for the result signal p(k). The inputs enable the evaluation algorithm of the evaluation unit to be made dependent on all the parameters available as a rule in a sigma-delta modulator. The parameters depend in particular on the spectral forming of the feedback signals by filters which can be selected to suit the sigma-delta modulator's required embodiment. The evaluation algorithm may also be referred to as a predication algorithm.

In a development of the invention the quantizer images its input signal p(k) onto an output signal y(k) having four, preferably two signal statuses. The stability of the sigma-delta modulator according to the invention is also increased when the number of signal statuses of the output signal is small. As the maximum reduction in signal statuses to only two output signal statuses leads particularly frequently and markedly to instabilities in the known sigma-delta-modulators, the maximum reduction in signal statuses of the output signal is the present invention's most effective application.

At least two sigma-delta modulators are arranged particularly advantageously in cascaded fashion, with at least one cascade stage including a sigma-delta modulator having an evaluation unit or predicator. The cascaded sigma-delta modulators can in particular be arranged in such a way that the differential signal is decoupled in the sigma-delta modulator of the cascade stage i, with $1 \leq i \leq$ (number of cascade stages minus one), and is used in the cascade stage i+1 as an input signal. A likewise increased, structurally engendered, stability of the sigma-delta converter can be achieved as a result of cascading the sigma-delta modulators. Cascaded sigma-delta converters furthermore make it possible to increase the maximum dynamic amplitude of the input signal x(k). Alongside increased stability in terms of operating characteristics, cascading also results in easier implementability because the order of the sigma-delta modulator can be reduced owing to cascading. A sigma-delta modulator having i cascade stages is expanded into a sigma-delta modulator having i+1 cascade stages simply by adding a cascade stage without modifying the structure of preceding stages.

The sigma-delta modulators according to the invention can basically be used in any suitable sigma-delta converters.

The sigma-delta modulators according to the invention can on the one hand be used for digital-to-analog conversion. In this case, for digital-to-analog conversion the sigma-delta converters include a sigma-delta modulator according to the invention as described above and, connected downstream of this, a digital-to-analog converter.

The sigma-delta modulators according to the invention can, on the other hand, also be used for analog-to-digital conversion. In this case, for analog-to-digital conversion the sigma-delta converters include an analog-to-digital converter and, connected downstream of this, a sigma-delta modulator according to the invention as described above. The delay element can in this case be embodied employing, for instance, SC (Switched Capacitor) technology.

With regard to an economical and technically flexible mode of production, the sigma-delta converter can be manufactured using CMOS (Complementary Metal-Oxide-Silicon) technology. This applies to both digital-to-analog and analog-to-digital conversion.

The sigma-delta converters according to the invention for digital-to-analog conversion and also for analog-to-digital conversion are eminently suitable for use in a radio communication system. The sigma-delta converter is used in particular for digital-to-analog conversion in radio communication transmitting devices and also for analog-to-digital conversion in radio communication receiving devices.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
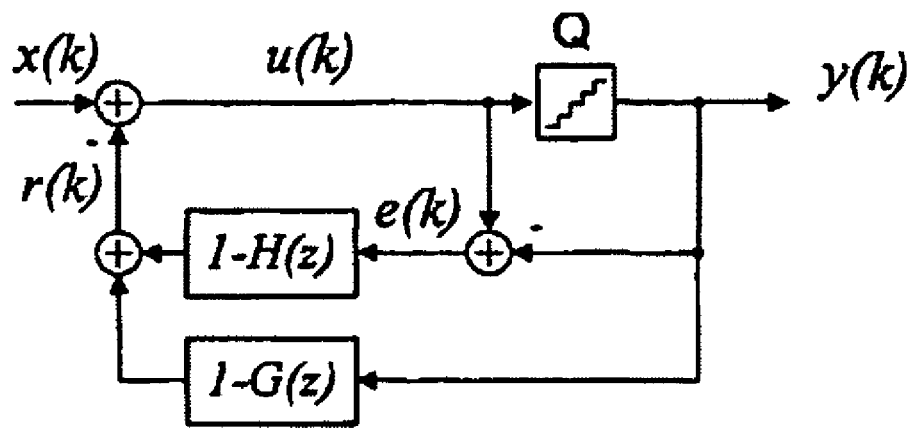
FIG. 1 is a block diagram of a sigma-delta modulator according to the related art.

Reference will now be made in detail to the preferred embodiments of the present invention, examples of which are illustrated in the accompanying drawings, wherein like reference numerals refer to like elements throughout.

FIG. 1 shows the structure of a sigma-delta modulator according to the related art. Using the two filters 1-H(z) and 1-G(z), the useful signal x(k) is spectrally formed according to the signal transmission function $$STF(z) = \frac{1}{G(z)}$$

and the noise e(k) of the quantizer Q produced from the differential signal of the output signal y(k) and of the intermediate input signal u(k) of the quantizer is spectrally formed according to the noise transmission function $$NTF(z) = \frac{H(z)}{G(z)}$$

The intermediate signal u(k) is here produced as the differential signal from the input signal x(k) and the fed-back total signal r(k) from the useful signal y(k) formed with 1-G(Z) and the noise signal e(k) of the quantizer Q formed with 1-H(z).

What is essential now is that the decision of the quantizer Q is made based on the momentary value of the intermediate signal u(k) and hence x(k). This results in significant instabilities if the sigma-delta modulator is of higher order and the noise transmission function is poorly selected.

Figure 2:
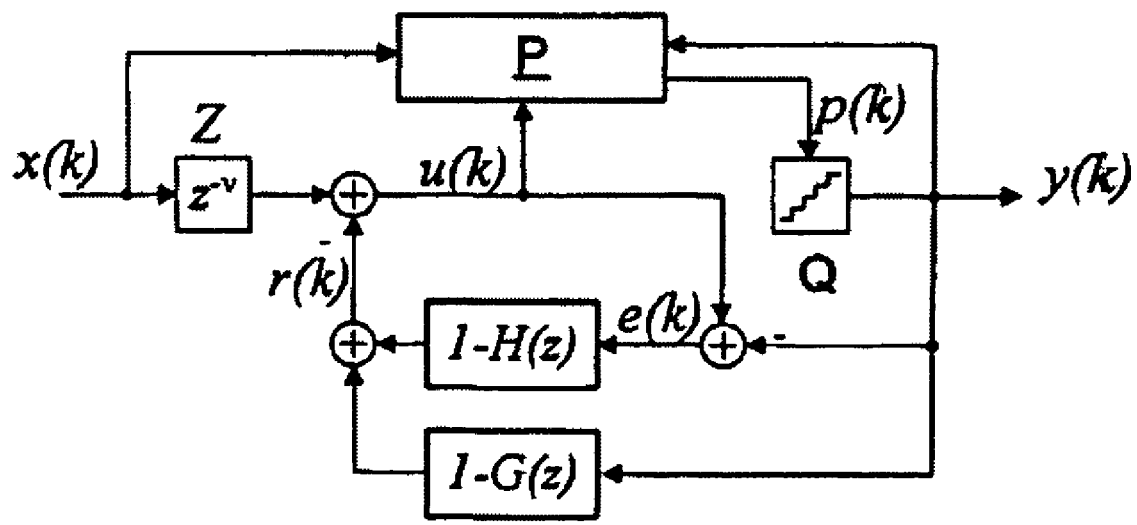
FIG. 2 is a block diagram of a sigma-delta modulator according to the invention having an evaluation unit.

According to the invention the decision algorithm of the sigma-delta modulators is now expanded to include a decision unit—referred to below as predicator P—with a predication algorithm, which has been embodied in FIG. 2. The input signal x(k) is hereby delayed by a certain length of time, indicated by the delay element Z. The delay element Z causes a v-times delay by the time pulse $z^{-1}$ and is therefore symbolized by $z^{-v}$. The non-delayed input signal x(k), as well as the delayed intermediate signal u(k) and output signal y(k) of the quantizer Q are routed to the predicator P and hence to the predication algorithm, whose output signal p(k) determines the statuses assumed by the quantizer Q.

The advantage of this method compared to the related art is that, from the sigma-delta algorithm's viewpoint, the decisions of the quantizer Q are made based also on future data. The causality continues to be ensured on account of the delay element Z shown in FIG. 2. The decisions are consequently subject less arbitrarily to the momentary status and the quantizing noise in the useful band can be reduced.

The application according to the invention of the predication algorithm will be described below with the aid of two examples.

The first application proceeds from a known special case of a sigma-delta modulator shown in FIG. 1: G(z)=1 and H(z)=$(1-z^{-1})^3$. This choice of noise transmission function results in malfunctioning of a known sigma-delta modulator.

The following predication values can be calculated with v=2 the number of shifted time pulses and 1-H(z)=$3z^{-1}-3z^{-2}+z^{-3}$:

$$u(k)=x(k-2)+3e(k-1)-3e(k-2)+e(k-3)$$

$$\hat{u}_{+1}(k)=x(k-1)+3u(k)-3e(k-1)+e(k-2)$$

$$\hat{u}_{+2}(k)=x(k)+3\hat{u}_{+1}(k)-3u(k)+e(k-1)$$

Thus with $$e(k)=u(k)-y(k)$$

$$e(k+1)=\hat{u}_{+1}(k)-3y(k)-y(k+1)$$

$$e(k+2)=\hat{u}_{+2}(k)-6y(k)-3y(K+1)-y(k+2)$$

not only the current output value of the sigma-delta modulator but also the value range of future input signals x(k) and decisions goes into the decision process. If the sigma-delta modulator has a two-stage output signal y(k) it is possible, for example, to take $$y(k) = \begin{cases} 1 & \text{for } \hat{u}_{+2}(k) \geq 0 \\ -1 & \text{for } \hat{u}_{+2}(k) < 0 \end{cases}$$

as the basis for the decision. y(k) is therefore selected such that y(k+1) and y(k+2) can largely compensate it again in the next time steps. The previously unstable sigma-delta modulator is thus stabilized. The essential modification of the sigma-delta modulator compared to the known approach includes the newly added skew of the input signal with respect to the output signal. In the example considered above, these are 2 time pulses (v=2).

For $\hat{u}_{+2}(k)$ it is possible to derive a recursion formula facilitating an efficient implementation:

$$\hat{u}_{+2}(k)=x(k)+3\hat{u}_{+2}(k-1)-3\hat{u}_{+2}(k-2)+\hat{u}_{+2}(k-3)+10y(k-1)-15y(k-2)+6y(k-3)$$

The following is advantageous in the case of a three-stage signal having three signal statuses 1, 0, -1:

$$y(k) = \begin{cases} 1 & \text{for} & (\hat{u}_{+1}(k) \geq 1) \wedge (\hat{u}_{+2}(k) \geq 0) \\ -1 & \text{for} & (\hat{u}_{+1}(k) < -1) \wedge (\hat{u}_{+2}(k) < 0) \\ 0 & \text{otherwise} \end{cases}$$

What remains problematical despite the predication P is the sigma-delta modulator's maximum dynamic amplitude, which in the above example is 0.5. For this reason a sigma-delta modulator having the advantages of the stability in terms of operating characteristics and easier implementability of a cascaded approach having the advantages of a small number of stages of a higher-order feedback loop was presented in DE 199 37 246 A1. As a result of the use of a predication algorithm introduced in this patent application in at least one cascade stage, the above described variations in the quantized signal in the time domain only occur to a reduced extent; the bandwidth of the last cascade stages is extended.

Figure 3:
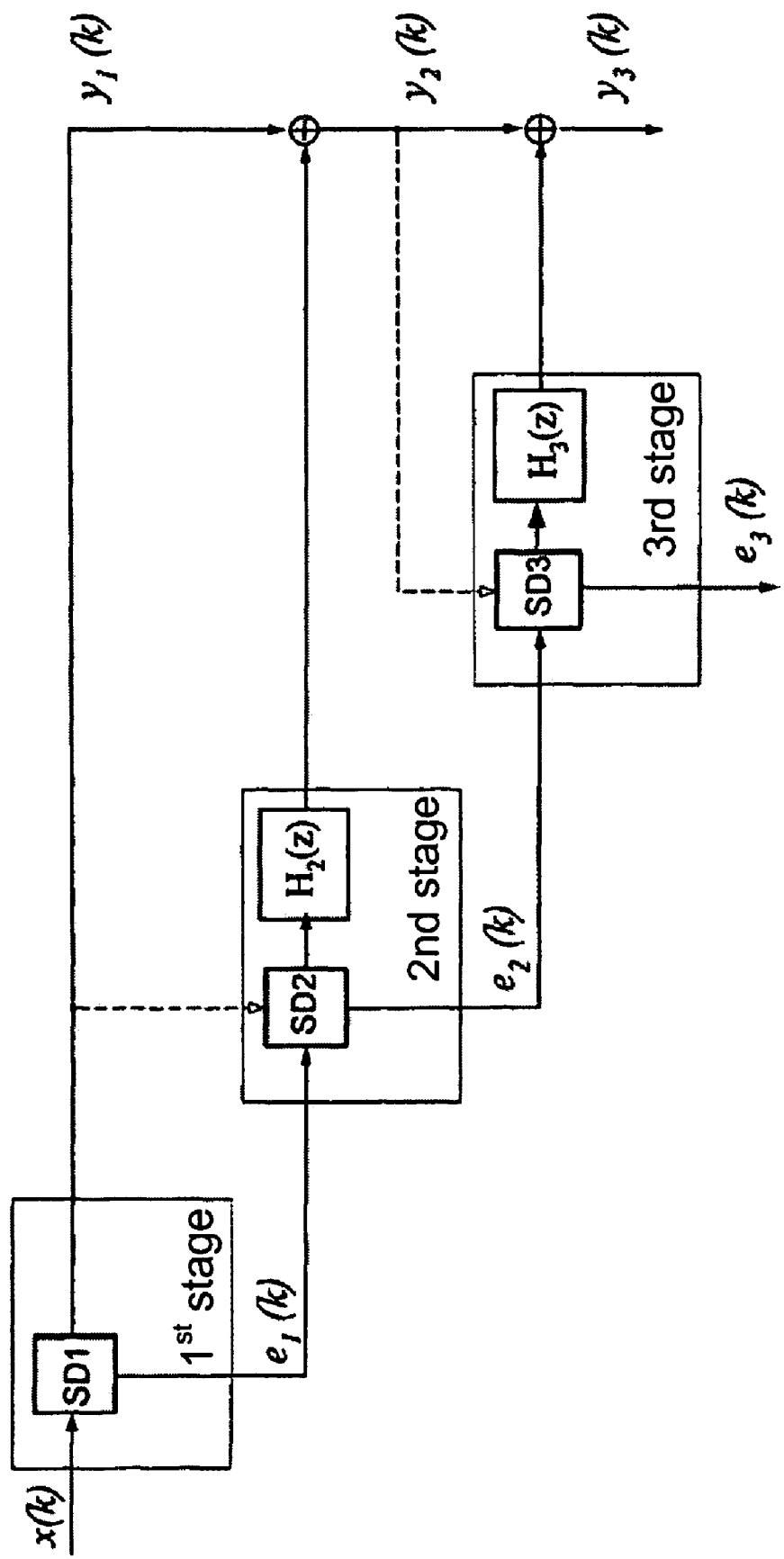
FIG. 3 is a block diagram of a cascaded sigma-delta modulator according to the invention.

FIG. 3 shows a conditioned cascaded sigma-delta algorithm. The quantizing error of one modulator is here made available to the next as an input signal.

The mode of operation of the conditioned cascaded sigma delta-modulator is described below with the aid of the application of a 1-bit output signal for the case of a third-order sigma-delta modulator. The third stage, considered below, of the conditioned cascaded sigma-delta modulator receives $e_2(k)$ as an input signal and, for stability reasons, has been used in the exemplary application presented in DE 199 37 246 A1 only with a three-stage sigma-delta output signal.

$$\hat{y}_3(k) = \begin{cases} \hat{y}_3(k)+1 & \text{for} \quad ((\tilde{x}_3(k) \geq 1) \wedge (y_2(k) - \tilde{y}_3(k-1) < 1) \wedge (y_2(k+1) = 1) \wedge (\tilde{y}_3(k) < 1)) \wedge \\ & \quad ((1 > \tilde{x}_3(k) \geq -1) \wedge (y_2(k) - y_3(k-1) < 1) \wedge (y_2(k+1) = 1) \wedge (\hat{y}_3(k) < 0)) \\ \hat{y}_3(k)-1 & \text{for} \quad ((\tilde{x}_3(k) \leq -1) \wedge (y_2(k) - \tilde{y}_3(k-1) > -1) \wedge (y_2(k+1) < 1) \wedge (\hat{y}_3(k) > -1)) \wedge \\ & \quad ((1 > \tilde{x}_3(k) \geq -1) \wedge (y_2(k) - \tilde{y}_3(k-1) > -1) \wedge (y_2(k+1) < 1) \wedge (\hat{y}_3(k) > 0)) \\ \hat{y}_3(k) & \text{otherwise} \end{cases}$$

Figure 4:
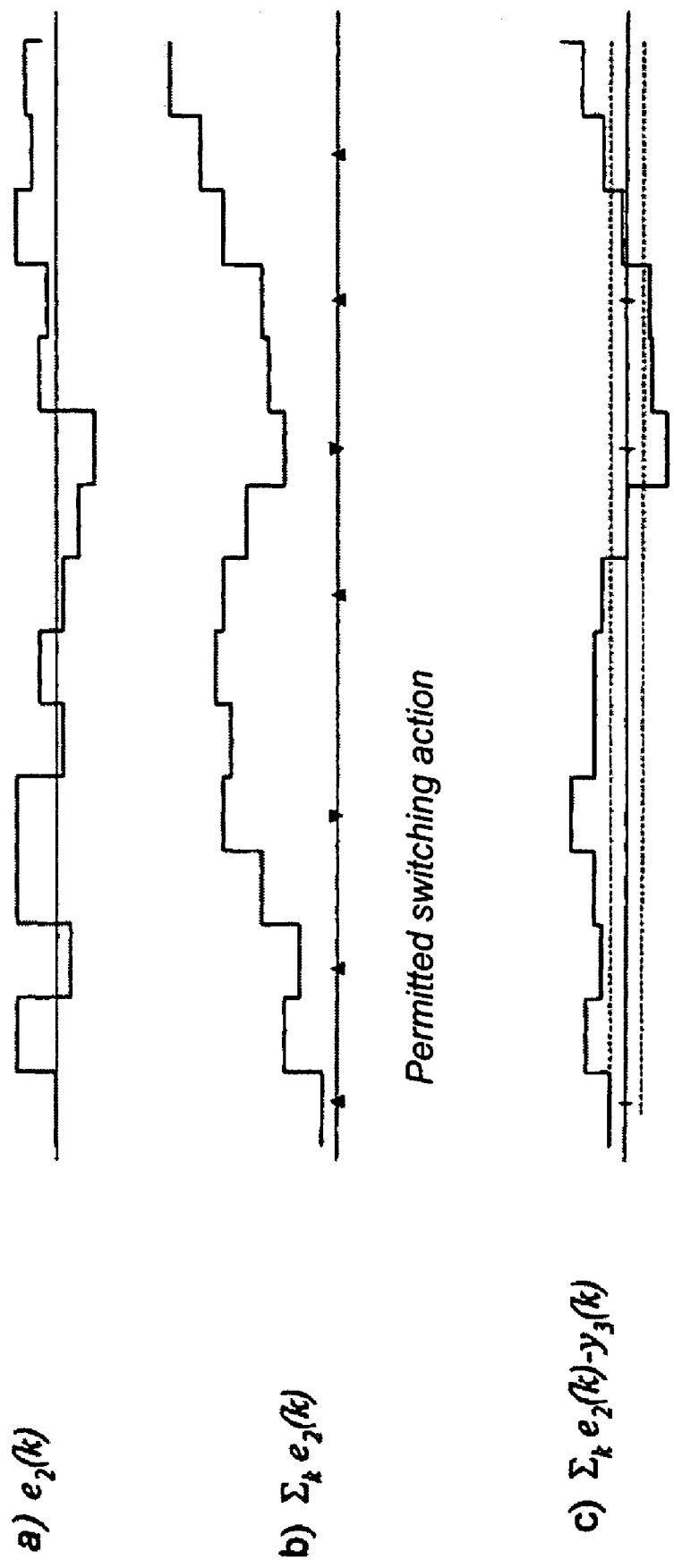
FIGS. 4(a)–4(c) are waveforms for an example of a decision algorithm according to the related art.

FIG. 4 illustrates the problem occurring here for the application presented in DE 199 37 246 A1. FIG. 4a) shows an exemplary curve of the input signal of the third stage. The signal is totaled by the digital integrator contained implicitly in the sigma-delta modulator ($\Sigma_k e_2(k)$ in FIG. 4b)). It can be seen that large numerical values can occur for the integrated signal. The decision-maker's output signal $\hat{y}_3(k)$ should ideally now counter this characteristic. However, not all instants in time are permitted for a status change from $\hat{y}_3(k)$ owing to the secondary condition's requiring the output signal y(k) to be two-stage. The permitted changeover instants are indicated by arrows in FIG. 4b) as an example. An upward-pointing arrow indicates that the change from $\hat{y}_3(k)=-2$ to $\hat{y}_3(k)=0$ or, as the case may be, from $\hat{y}_3(k)=0$ to $\hat{y}_3(k)=2$ is permitted. A downward-pointing arrow correspondingly indicates that the change from $\hat{y}_3(k)=2$ to $\hat{y}_3(k)=0$ or, as the case may be, from $\hat{y}_3(k)=0$ to $\hat{y}_3(k)=-2$ is permitted.

FIG. 4c) shows the characteristic in the signal ($\Sigma_k e_2(k) - y_2(k)$) when the possible switching actions occur favorably. The error signal of the third stage can be seen to be reduced. FIG. 4c) illustrates, in contrast to this, the case where the switching action is only permitted with a delay, as a result of which the error signal exhibits a high degree of overshooting.

Figure 5:
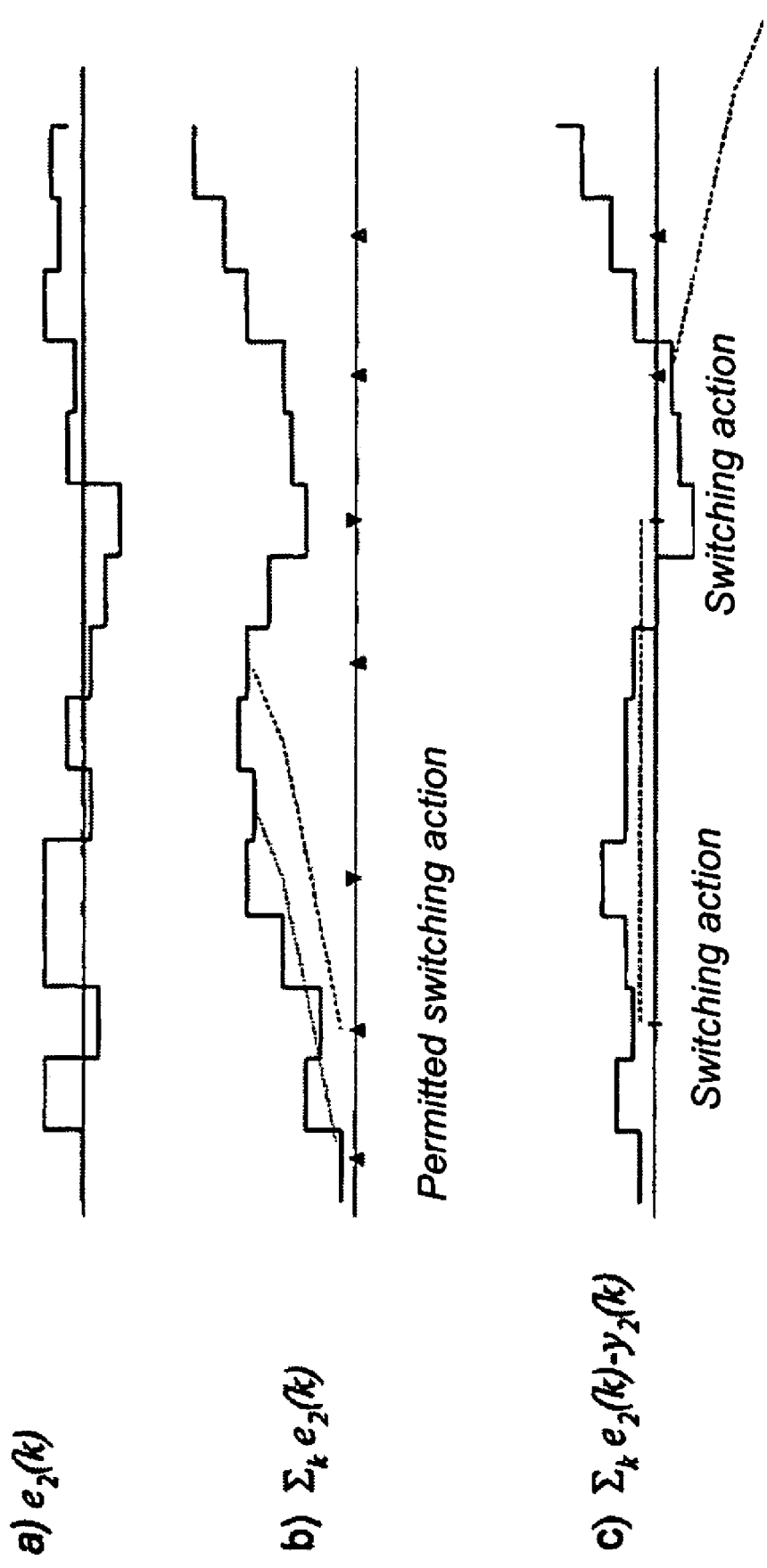
FIGS. 5(a)–5(c) are waveforms for an example of a corresponding decision algorithm according to the present invention.

FIG. 5 proceeds from the same output signal of the second stage and the same decision instants as in FIG. 4. However, the decision-maker now operates using a predication algorithm:

$$\tilde{x}_{3p}(k) = \tilde{x}_3(k) + e_2(k+1) - \hat{y}_3(k-1)$$

$$\tilde{x}_{3p1}(k) = \tilde{x}_{3p}(k) + e_2(k+2) - \hat{y}_3(k-1)$$

$$\tilde{x}_{3p2}(k) = \tilde{x}_{3p1}(k) + e_2(k+3) - \hat{y}_3(k-1)$$

$$\tilde{x}_{3p3}(k) = \tilde{x}_{3p2}(k) + e_2(k+4) - \hat{y}_3(k-1)$$

$$\hat{y}_3(k) = \begin{cases} \hat{y}_3(k)+1 & \text{for} \quad ((x_3(k) \geq 1) \wedge (x_{3p}(k) \geq 1) \wedge (x_{3p1}(k) \geq 1) \wedge (x_{3p2}(k) \geq 1) \wedge (x_{3p3}(k) \geq 2) \wedge (y_2(k) - \tilde{y}_3(k-1) < 1) \wedge (y_2(k+1) = 1) \wedge (\hat{y}_3(k) < 1)) \wedge \\ & \quad ((1 > x_3(k) \geq -1) \wedge (y_2(k) - \tilde{y}_3(k-1) < 1) \wedge (y_2(k+1) = 1) \wedge (\hat{y}_3(k) < 0)) \\ \hat{y}_3(k)-1 & \text{for} \quad ((x_3(k) < -1) \wedge (x_{3p}(k) < -1) \wedge (x_{3p1}(k) < -1) \wedge (x_{3p2}(k) < -1) \wedge (x_{3p3}(k) < -2) \wedge (y_2(k) - \tilde{y}_3(k-1) > -1) \wedge (y_2(k+1) < 1) \wedge (\hat{y}_3(k) > -1)) \wedge \\ & \quad ((1 > x_3(k) \geq -1) \wedge (y_2(k) - \tilde{y}_3(k-1) > -1) \wedge (y_2(k+1) < 1) \wedge (\hat{y}_3(k) > 0)) \\ \hat{y}_3(k) & \text{otherwise} \end{cases}$$

Possible overshooting in the error signal 1 is thus determined in advance and so avoided. FIGS. 5 b) and 5 c) show as a dashed line the thresholds for the integrated error which have to be exceeded for a permitted switching action also to be performed.

The invention has been described in detail with particular reference to preferred embodiments thereof and examples, but it will be understood that variations and modifications can be effected within the spirit and scope of the invention.

The invention claimed is:

1. A sigma-delta modulator for converting digital input signals, comprising:
   at least one stage having
      a first feedback loop of a spectrally formed output signal of the sigma-delta modulator, dependent on a discrete independent time variable;
      a second feedback loop of a spectrally formed output differential signal obtained from the output signal and an intermediate signal formed by an input differential signal of an input signal and the total signal of the first and second feedback loops;
      a quantizer determining the output signal based on the intermediate signal; and
      skew means for generating a skew between the output and input signals, including at least one delay element creating a skew between clock cycles dependent on the discrete independent time variable, each clock cycle being a difference between two succeeding values of the discrete independent time variable.

2. A sigma-delta modulator according to claim 1, wherein said at least one delay element delays the input signal before the input differential signal is formed from the input signal and total signal of the first and second feedback loops.

3. A sigma-delta modulator according to claim 2, further comprising an evaluation unit, connected upstream of said quantizer, supplying a result signal to said quantizer.

4. A sigma-delta modulator according to claim 3, wherein said evaluation unit includes inputs for the input signal, the intermediate signal and the output signal, and an output for the result signal.

5. A sigma-delta modulator according to claim 4, wherein said quantizer images the result signal onto the output signal which has at least two signal statuses.

6. A sigma-delta modulator according to claim 5,
wherein the at least one stage is at least two stages arranged in cascaded fashion, and
wherein at least one of the stages includes an evaluation unit.

7. A sigma-delta modulator according to claim 6, wherein the at least two stages include
a first stage in which the spectrally formed output differential signal is decoupled; and
at least one subsequent stage receiving the spectrally formed output differential signal from a preceding stage as the input signal.

8. A radio communication system, comprising a sigma-delta modulator according to claim 1.

9. A sigma-delta converter for digital-to-analog conversion comprising a sigma-delta modulator according to claim 1 and a digital-to-analog converter.

10. A sigma-delta converter according to claim 9, wherein the sigma-delta converter is manufactured using CMOS technology.

11. A radio communication system, comprising a sigma-delta converter according to claim 9.

12. A sigma-delta converter for analog-to-digital conversion comprising a sigma-delta modulator according to claim 1 and an analog-to-digital converter.

13. A sigma-delta converter according to claim 12, wherein the sigma-delta converter is manufactured using CMOS technology.

14. A radio communication system, comprising a sigma-delta converter according to claim 12.

* * * * *